(12) United States Patent
Kato (10) Patent No.: US 9,373,072 B2
(45) Date of Patent: Jun. 21, 2016

(54) ANTENNA, METHOD OF MANUFACTURING THE ANTENNA, AND WIRELESS IC DEVICE

(75) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 822 days.

(21) Appl. No.: 13/406,599

(22) Filed: Feb. 28, 2012

(65) Prior Publication Data

US 2012/0153029 A1    Jun. 21, 2012

Related U.S. Application Data

(63) Continuation of application No. PCT/JP2010/061344, filed on Jul. 2, 2010.

(30) Foreign Application Priority Data

Sep. 9, 2009   (JP) .................................. 2009-208564

(51) Int. Cl.
*H01Q 1/22*        (2006.01)
*G06K 19/077*      (2006.01)
(Continued)

(52) U.S. Cl.
CPC .... *G06K 19/07754* (2013.01); *G06K 19/07749* (2013.01); *G06K 19/07786* (2013.01);
(Continued)

(58) Field of Classification Search
CPC ............. H01Q 1/38; H01Q 7/00; H01Q 9/26; H01Q 11/04; H01Q 11/14; H01Q 1/2225; G06K 19/07749; G06K 19/07754; G06K 19/07786
USPC ................. 343/741, 867, 833, 834, 803, 804; 235/492; 340/10.1, 572.7
See application file for complete search history.

(56) References Cited

U.S. PATENT DOCUMENTS 3,245,082 A * 4/1966 Rosenberry .............. H01Q 9/26
                                                      343/803
3,689,929 A * 9/1972 Moody .................... H01Q 9/26
                                                      343/802
(Continued)

FOREIGN PATENT DOCUMENTS

JP        10-293828 A     11/1998
JP      2001-273472 A     10/2001
(Continued)

OTHER PUBLICATIONS

Official Communication issued in International Patent Application No. PCT/JP2010/061344, mailed on Oct. 5, 2010.
(Continued)

*Primary Examiner* — Michael C Wimer
(74) *Attorney, Agent, or Firm* — Keating & Bennett, LLP (57) ABSTRACT

An antenna includes first and second radiation portions including one lead wire that is folded back into a loop shape to define a folded-back portion and that includes a first power feed portion at a first end and a second power feed portion at a second end. The lead wire portion extending toward the folded-back portion and the lead wire portion extending through the folded-back portion are close enough to each other near each of the first and second power feed portions in the first and second radiation portions, respectively, to be electromagnetically coupled to each other. The power feed portions of the antenna are coupled to a wireless IC chip. The power feed portions may be coupled to a feed circuit in a feed circuit board coupled to a wireless IC.

9 Claims, 5 Drawing Sheets (51) Int. Cl.
*H01Q 7/00* (2006.01)
*H01Q 9/26* (2006.01)

(52) U.S. Cl.
CPC ............... *H01Q1/2225* (2013.01); *H01Q 7/00* (2013.01); *H01Q 9/26* (2013.01); *H01L 2224/45147* (2013.01); *H01L 2224/4813* (2013.01); *H01L 2924/3011* (2013.01); *H01L 2924/30107* (2013.01); *Y10T 29/49016* (2015.01)

(56) References Cited

U.S. PATENT DOCUMENTS

| | | | |
|---|---|---|---|
| 4,381,566 A * | 4/1983 | Kane | H01Q 1/36 343/713 |
| 7,817,102 B2 * | 10/2010 | Taki et al. | 343/895 |
| 8,412,290 B2 * | 4/2013 | Shamim et al. | 455/575.7 |
| 2002/0163470 A1 | 11/2002 | Nagumo et al. | |
| 2006/0192718 A1 | 8/2006 | Ando et al. | |
| 2007/0200711 A1 | 8/2007 | Kai et al. | |
| 2008/0284662 A1 | 11/2008 | Yagi | |
| 2009/0201156 A1 | 8/2009 | Kato | |

FOREIGN PATENT DOCUMENTS

| | | |
|---|---|---|
| JP | 2002-330025 A | 11/2002 |
| JP | 2003-218624 A | 7/2003 |
| JP | 2006-185050 A | 7/2006 |
| JP | 2006-235825 A | 9/2006 |
| JP | 2007-311955 A | 11/2007 |
| JP | 2008-086038 A | 4/2008 |
| JP | 2008-182438 A | 8/2008 |
| JP | 2008-288867 A | 11/2008 |
| WO | 2006/064540 A1 | 6/2006 |
| WO | 2009/001814 A1 | 12/2008 |

OTHER PUBLICATIONS

Official Communication issued in corresponding Japanese Patent Application No. 2011-530778, mailed on Jun. 18, 2013.

* cited by examiner

ANTENNA, METHOD OF MANUFACTURING THE ANTENNA, AND WIRELESS IC DEVICE

BACKGROUND OF THE INVENTION

1. Field of the Invention

The present invention relates to antennas. More particularly, the present invention relates to an antenna preferably for use in the Ultra High-Frequency (UHF) band, a method of manufacturing the antenna, and a wireless IC device including the antenna.

2. Description of the Related Art

Radio Frequency Identification (RFID) systems have been developed as article management systems. In such an RFID system, a reader-writer producing electromagnetic waves communicates with a wireless integrated circuit (IC) (also referred to as, for example, an IC tag or a wireless IC device) in a non-contact manner to transmit information. The wireless IC is attached to, for example, an article or a container and stores certain information. The wireless IC is coupled to an antenna to enable communication with the reader-writer.

Japanese Unexamined Patent Application Publication No. 2007-311955 discloses a non-contact IC tag including a linear half-wave dipole antenna on one surface of a plastic base and an IC chip electrically connected between the left and right quarter-wave antennas. This antenna has a certain pattern etched on a metal layer provided on the plastic base.

However, there are problems in that the plastic base made of polyethylene terephthalate (PET), etc. is deformed at high temperature and that the waste fluid in the etching causes environmental pollution.

SUMMARY OF THE INVENTION

In order to solve the above problems, preferred embodiments of the present invention provide an antenna having a simple configuration, a simple manufacturing process, and excellent heat resistance, a method of manufacturing the antenna, and a wireless IC device.

An antenna according to a first preferred embodiment of the present invention includes a radiation portion including a lead wire that is folded back into a loop shape to define a folded-back portion and that includes a power feed portion at one end thereof. A lead wire portion extending toward the folded-back portion and a lead wire portion extending through the folded-back portion are close enough to each other near the power feed portion in the radiation portion to be electromagnetically coupled to each other.

An antenna according to a second preferred embodiment of the present invention includes first and second radiation portions including a lead wire that is folded back into a loop shape to define a folded-back portion and that includes a first power feed portion at one end thereof and a second power feed portion at another end thereof. A lead wire portion extending toward the folded-back portion and a lead wire portion extending through the folded-back portion are close enough to each other near each of the first and second power feed portions in the first and second radiation portions, respectively, to be electromagnetically coupled to each other.

A method of manufacturing an antenna according to a third preferred embodiment of the present invention includes a step of preparing a lead wire; and a step of forming a radiation portion by folding back the one lead wire into a loop shape to define a folded-back portion by using a power feed portion at one end of the lead wire as a starting point. A lead wire portion extending toward the folded-back portion and a lead wire portion extending through the folded-back portion are arranged so as to be close or adjacent to each other near the power feed portion in the step of forming the radiation portion.

A method of manufacturing an antenna according to a fourth preferred embodiment of the present invention includes a step of preparing a lead wire; and a step of forming first and second radiation portions by folding back the one lead wire into loop shapes to define a folded-back portion by using a first power feed portion at one end of the lead wire, and a second power feed portion at another end of the lead wire, as starting points. A lead wire portion extending toward the folded-back portion and a lead wire portion extending through the folded-back portion are arranged close to each other near or adjacent to each of the first and second power feed portions in the step of forming the first and second radiation portions, respectively.

A wireless IC device according to a fifth preferred embodiment of the present invention includes an antenna including a radiation portion including a lead wire that is folded back into a loop shape to define a folded-back portion and that includes a power feed portion at one end thereof, a lead wire portion extending toward the folded-back portion and a lead wire portion extending through the folded-back portion being close enough to each other near the power feed portion in the radiation portion to be electromagnetically coupled to each other; and a feed circuit board including a feed circuit coupled to a wireless IC. The feed circuit is coupled to the power feed portion of the antenna.

A wireless IC device according to a sixth preferred embodiment of the present invention includes an antenna including first and second radiation portions including a lead wire that is folded back into a loop shape to define a folded-back portion and that includes a first power feed portion at one end thereof and a second power feed portion at another end thereof, a lead wire portion extending toward the folded-back portion and a lead wire portion extending through the folded-back portion being close enough to each other near each of the first and second power feed portions in the first and second radiation portions, respectively, to be electromagnetically coupled to each other; and a wireless IC chip or a feed circuit board including a feed circuit coupled to a wireless IC. The wireless IC chip or the feed circuit is coupled to the first and second power feed portions of the antenna.

In the antenna and the wireless IC device according to various preferred embodiments of the present invention, the lead wire portions defining the radiation portion are close enough to each other to cause electromagnetic coupling between the lead wire portions and signals are transmitted through short paths. Accordingly, the signals flow in the same direction from the power feed portion and are radiated so that the function of an antenna is realized. The radiation portion has a simple configuration in which the radiation portion preferably includes a loop shaped lead wire and can be easily manufactured by partially being attached on a certain portion on a base made of paper or other suitable material. In addition, since there is no need to use, for example, a plastic film as the base, excellent heat resistance is achieved.

Furthermore, in the method of manufacturing the antenna according to a preferred embodiment of the present invention, it is possible to manufacture the antenna including the loop-shaped radiation portions such that the lead wire can be wired with, for example, a stitching machine.

According to various preferred embodiments of the present invention, it is possible to provide an antenna and a wireless IC device having a simple configuration, a simple manufacturing process such as wiring, and excellent heat resistance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of an antenna, a method of manufacturing the antenna, and a wireless IC device according to the present invention will herein be described with reference to the attached drawings. The same reference numerals are used in each drawing to identify the same or substantially the same components and portions. A duplicated description of such components and portions is omitted herein.

First Preferred Embodiment

Figure 1:
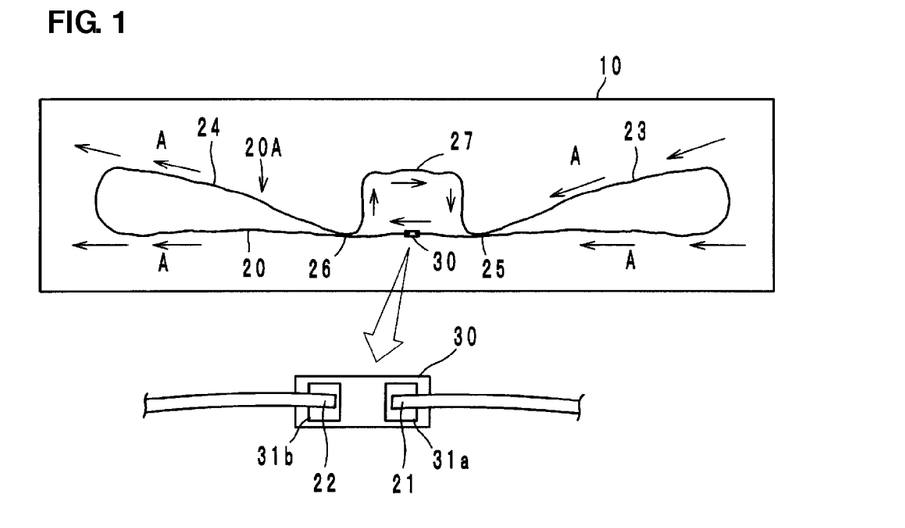
FIG. 1 is a plan view showing a wireless IC device according to a first preferred embodiment of the present invention.

A wireless IC device according to a first preferred embodiment includes an antenna 20A provided on a surface of a base 10 made of paper and a wireless IC chip 30 coupled to the antenna 20A, as shown in FIG. 1.

Figure 2:
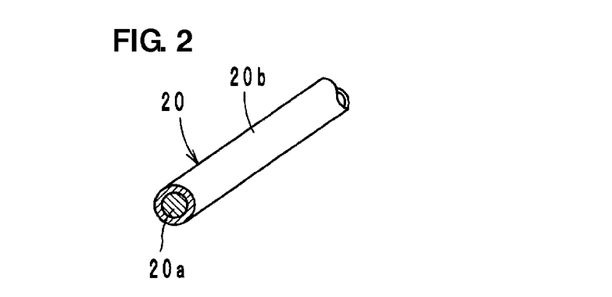
FIG. 2 is a perspective view showing a lead wire of the wireless IC device according to the first preferred embodiment of the present invention.

The antenna 20A includes a first radiation portion 23 and a second radiation portion 24 including one lead wire 20 that is folded back into a loop shape and that includes a first power feed portion 21 at one end thereof and a second power feed portion 22 at another end thereof. The lead wire portion 20 toward the folded-back portion and the lead wire portion 20 through the folded-back portion are close to each other near each of the first and second power feed portions 21 and 22 in the first and second radiation portions 23 and 24, respectively. Furthermore, the lead wire 20 is bent at proximity portions 25 and 26 to define a substantially rectangular loop and this loop portion defines an impedance matching portion 27 with the wireless IC chip 30. The lead wire 20 includes a core 20a preferably made of Cu covered with an insulating film 20b, as shown in FIG. 2. The lead wire portions 20 are electromagnetically coupled to each other via the insulating film 20b at the proximity portions 25 and 26.

Figure 3:
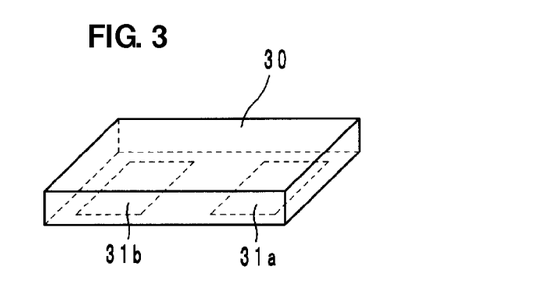
FIG. 3 is a perspective view showing a wireless IC chip of the wireless IC device according to the first preferred embodiment of the present invention.

The wireless IC chip 30 includes a clock circuit, a logic circuit, a memory circuit, and so on, as conventionally known, and necessary information is stored in the wireless IC chip 30. As shown in FIG. 3, the wireless IC chip 30 includes a pair of input-output terminal electrodes 31a and 31b provided thereon. In addition, the power feed portions 21 and 22 of the antenna 20A are electrically connected to the input-output terminal electrodes 31a and 31b, respectively.

In the antenna 20A having the above configuration, the lead wire portions 20 defining the radiation portions 23 and 24 are close to each other at the proximity portions 25 and 26, respectively, to cause electromagnetic coupling between the lead wire portions 20 and signals are transmitted through short paths. Accordingly, the signals supplied from the wireless IC chip 30 flow in the same direction shown by arrows A from the power feed portions 21 and 22 and are radiated. In addition, the signals input in a direction opposite to the arrows A are coupled to each other at the proximity portions 25 and 26 and are supplied to the wireless IC chip 30 from the power feed portions 21 and 22.

The gain is maximized when the line length of the radiation portions 23 and 24, that is, the length from the power feed portions 21 and 22 to the corresponding folded-back portions is $\lambda/4$, wherein $\lambda$ denotes a wavelength that is used. In addition, the impedance matching portion 27 has an impedance corresponding to the line length and performs impedance matching between the wireless IC chip 30 and the radiation portions 23 and 24.

The wireless IC device is operated in a manner in which a high-frequency signal (for example, within the UHF band) radiated from an RFID reader-writer is received by the radiation portions 23 and 24 and a reception signal of a certain frequency is supplied to the wireless IC chip 30 through the power feed portions 21 and 22. The wireless IC chip 30 extracts certain energy from the received signal, reads out information that is stored by using the energy as a driving source, radiates the information from the radiation portions 23 and 24 through the power feed portions 21 and 22 as a transmission signal, and transmits the transmission signal to the reader-writer. In other words, the radiation portions 23 and 24 function as a dipole antenna and are optimal for the UHF band.

A method of manufacturing the wireless IC device will now be described. First, the wireless IC chip 30 is arranged on the surface of the paper base 10 to which adhesive is applied with the terminal electrodes 31a and 31b extending upward and the first power feed portion 21 is soldered to the one terminal electrode 31a. Next, the lead wire 20 is arranged in a certain loop shape for wiring with a stitching machine that has been conventionally used as a wiring apparatus. Finally, the second power feed portion 22 is soldered to the other terminal electrode 31b. As a result, the antenna 20A having the shape shown in FIG. 1 is manufactured. For such wiring, a copper wire having a diameter of, for example, about 50 μm to about 300 μm in which the surface of the core 20a is covered with the insulating film 20b, as shown in FIG. 2, is preferably used as the lead wire 20. The surface is covered with the insulating film 20b to prevent oxidation, etc., thus improving environmental resistance. In addition, the use of the copper wire facilitates the soldering and the connection with solder realizes a strong connection to improve the connection reliability.

In the above wireless IC device, the antenna 20A has a simple configuration in which the antenna 20A includes a loop shaped lead wire 20, and can be easily manufactured by partially being attached on a certain portion on the base 10 made of paper or other suitable material. In addition, since there is no need to use, for example, a plastic film as the base 10, excellent heat resistance is achieved. It is possible to easily manufacture the antenna 20A including the loop-shaped radiation portions 23 and 24 such that the lead wire 20 can be wired with a stitching machine.

Furthermore, the radiation portions 23 and 24 can be shaped into large loops to increase the antenna gain. In this point of view, the radiation portions 23 and 24 advantageously each have a substantially trapezoidal shape shown in FIG. 1.

The impedance matching portion 27 is not necessarily provided in the first preferred embodiment and may be omitted. When the matching portion 27 is omitted, the ends of the lead wire 20 are preferably coupled to each other in a shape providing high impedance.

Modified Preferred Embodiment

Figure 4:
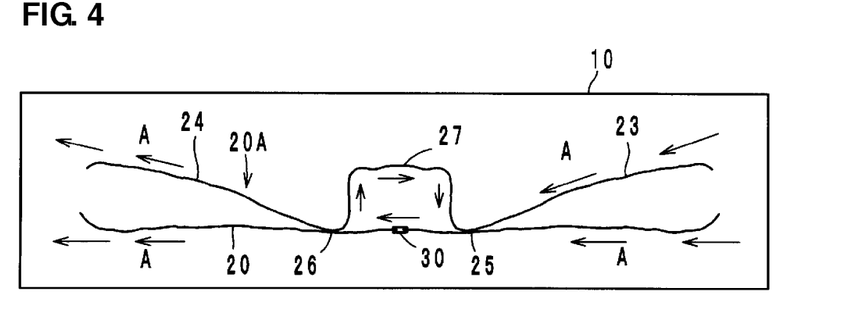
FIG. 4 is a plan view showing a wireless IC device according to a modification of the first preferred embodiment of the present invention.

The antenna 20A including the lead wire 20 in the first preferred embodiment may include the radiation portions 23 and 24 whose folded-back portions are partially cut out, as shown in FIG. 4. Also with this configuration, high-frequency signals can be transmitted and received. In this case, after the lead wire 20 is wired on the surface of the paper base 10 or while the lead wire 20 is being wired on the surface of the paper base 10, the folded-back portions are partially cut out.

Second Preferred Embodiment

Figure 5:
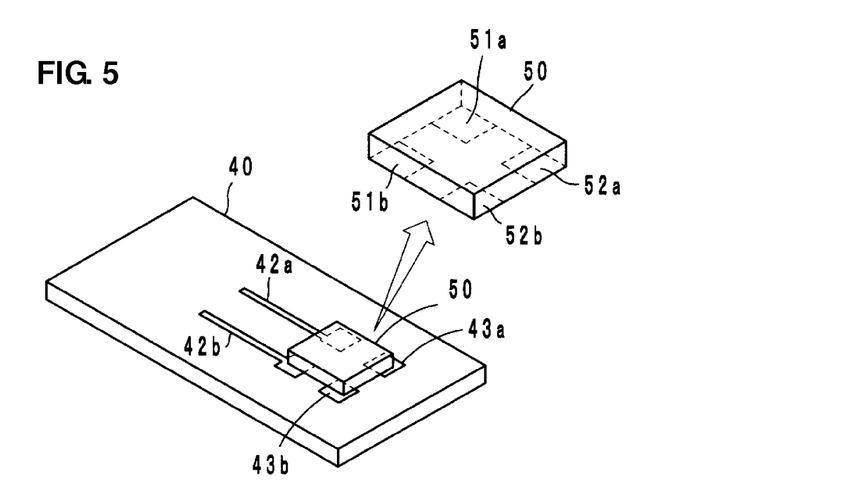
FIG. 5 is a perspective view showing a wireless IC chip and a feed circuit board of a wireless IC device according to a second preferred embodiment of the present invention.

A wireless IC device according to a second preferred embodiment includes a feed circuit board 40 sandwiched between a wireless IC chip 50 and the antenna 20A shown in the first preferred embodiment, as shown in FIG. 5. A body resulting from integration of the feed circuit board 40 with the wireless IC chip 50 mounted on the feed circuit board 40 in the above manner is also called an electromagnetic coupling module.

The feed circuit board 40 incorporates a feed circuit, as described below with reference to FIG. 6. This feed circuit is electromagnetically coupled to the power feed portions 21 and 22 of the antenna 20A and is also coupled to input-output terminal electrodes 51a and 51b of the wireless IC chip 50. In addition, the wireless IC chip 50 used in the second preferred embodiment is also provided with mounting terminal electrodes 52a and 52b.

Figure 6:
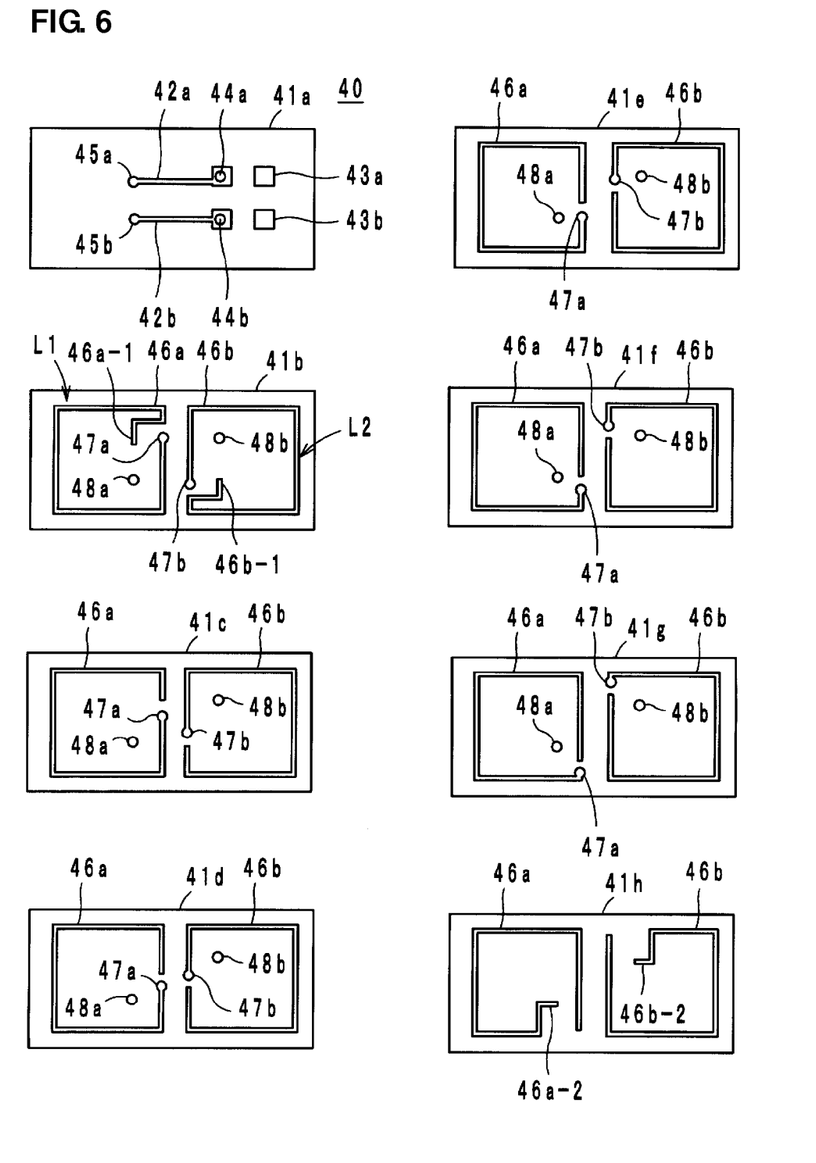
FIG. 6 is a plan view showing a layered structure of the feed circuit board shown in FIG. 5.

The feed circuit includes a resonant circuit-matching circuit including inductance elements L1 and L2 that have different inductance values and that are magnetically coupled in opposite phases, as shown in FIG. 6. In the wireless IC chip 50, the input-output terminal electrodes 51a and 51b are electrically connected to feed terminal electrodes 42a and 42b provided on the feed circuit board 40 via metal bumps or other suitable members and the mounting terminal electrodes 52a and 52b are electrically connected to mounting electrodes 43a and 43b via metal bumps or other suitable members.

The inductance elements L1 and L2 included in the feed circuit are magnetically coupled in opposite phases to resonate with a frequency processed by the wireless IC chip 50 and are electromagnetically coupled to the power feed portions 21 and 22 of the antenna 20A, respectively. In addition, the feed circuit performs the impedance matching between the wireless IC chip 50 and the radiation portions 23 and 24.

Accordingly, the feed circuit transmits a transmission signal having a certain frequency from the wireless IC chip 50 to the antenna 20A and selects a reception signal having a certain frequency from signals received with the antenna 20A to supply the selected reception signal to the wireless IC chip 50. As a result, in the wireless IC device, the wireless IC chip 50 is operated with the signal received by the antenna 20A and a response signal from the wireless IC chip 50 is externally radiated by the antenna 20A.

As described above, since the frequency of a signal preferably is set in the feed circuit provided in the feed circuit board 40 in the second preferred embodiment, the wireless IC device operates as it is even if the wireless IC device is mounted on various articles. Accordingly, a variation in the radiation characteristics is prevented and it is not necessary to change the design of, for example, the antenna 20A for each article. In addition, the frequency of the transmission signal radiated from the antenna 20A and the frequency of the reception signal to be supplied to the wireless IC chip 50 are substantially determined by the resonant frequency of the feed circuit in the feed circuit board 40, and the maximum gain of the signals are substantially determined by at least one of the size of the feed circuit, the shape of the feed circuit, the distance between the feed circuit and the antenna 20A, and the medium between the feed circuit and the antenna 20A. Since the frequencies of the transmission and reception signals are determined in the feed circuit board 40, the frequency characteristics do not vary to achieve stable frequency characteristics, regardless of the shape, the size, the arrangement relationship, etc. of the antenna 20A, for example, even if the wireless IC device is rounded or is sandwiched between dielectric materials.

The structure of the feed circuit board 40 will now be described with reference to FIG. 6. The feed circuit board 40 is manufactured by stacking, pressure-bonding, and firing ceramic sheets 41a to 41h each made of a dielectric material or a magnetic material. The top sheet 41a preferably has the feed terminal electrodes 42a and 42b and the mounting electrodes 43a and 43b provided thereon and has via-hole conductors 44a, 44b, 45a, and 45b provided therein. The second to eight ceramic sheets 41b to 41h preferably each include line electrodes 46a and 46b composing the inductance elements L1 and L2 provided thereon and each have via-hole conductors 47a, 47b, 48a, and 48b provided therein, according to need.

Stacking the sheets 41a to 41h provides the inductance element L1 in which the line electrodes 46a on the respective sheets are spirally connected via the via-hole conductor 47a and provides the inductance element L2 in which the line electrodes 46b on the respective sheets are spirally connected via the via-hole conductor 47b. In addition, a capacitance is produced between the line electrodes 46a and 46b.

An end 46a-1 of the line electrode 46a on the sheet 41b is connected to the feed terminal electrode 42a via the via-hole conductor 45a, and an end 46a-2 of the line electrode 46a on the sheet 41h is connected to the feed terminal electrode 42b via the via-hole conductors 48a and 45b. An end 46b-1 of the line electrode 46b on the sheet 41b is connected to the feed terminal electrode 42b via the via-hole conductor 44b, and an end 46b-2 of the line electrode 46b on the sheet 41h is connected to the feed terminal electrode 42a via the via-hole conductors 48b and 44a.

Since the inductance elements L1 and L2 are wound in opposite directions in the feed circuit 11 described above, the magnetic field produced in the inductance element L1 is offset by the magnetic field produced in the inductance element L2. Since the magnetic fields are offset, it is necessary for the line electrodes 46a and 46b to have a rather increased length in order to achieve a desired inductance value. Increasing the length of the line electrodes 46a and 46b decreases the Q value to eliminate or reduce the steepness of the resonance characteristics, thus broadening the resonant characteristics near the resonant frequency.

The inductance elements L1 and L2 are provided at different leftward and rightward positions in a perspective plan view of the feed circuit board 40. The magnetic fields produced by the inductance elements L1 and L2 have opposite directions. Accordingly, coupling the feed circuit to the power feed portions 21 and 22 of the loop-shaped antenna 20A causes currents in opposite directions to be excited in the power feed portions 21 and 22 to allow transmission and reception of signals with the loop-shaped antenna 20A.

The feed circuit board 40 can be made of a magnetic material and the inductance elements L1 and L2 can be provided in the magnetic body to increase the inductance value. In addition, a variation in impedance with the wireless IC chip 50 can be absorbed even if variation in processing and/or variation in permeability of a magnetic sheet occur. The magnetic body preferably has a permeability μ of about 5 to about 70, for example.

Furthermore, by setting the inductance values of the two inductance elements L1 and L2 to substantially the same value, it is possible to make the magnitude of the magnetic field occurring in the inductance element L1 equal to that of the magnetic field occurring in the inductance element L2. As a result, the amount of offset of the magnetic field in the inductance element L1 can be made equal to that in the inductance element L2 to allow the resonant characteristics to be broadened near the resonant frequency.

The feed circuit board 40 may be a multi-layer board made of ceramic or resin or may be a board manufactured by stacking flexible sheets made of a dielectric material, such as polyimide or liquid crystal polymer, for example. In particular, incorporating the inductance elements L1 and L2 in the feed circuit board 40 causes the feed circuit to be resistant to the effect outside the board, thus preventing and suppressing a variation in the radiation characteristics.

The feed circuit board 40 is not necessarily attached on the power feed portions 21 and 22 of the antenna 20A and may be arranged near the power feed portions 21 and 22. In addition, the electromagnetic coupling module may be a module in which the wireless IC chip 50 is integrated with the feed circuit board 40 on one board, that is, may be a wireless IC including the feed circuit, instead of the one in which the wireless IC chip 50 is separated from the feed circuit board 40. The impedance matching portion 27 may be omitted in the antenna 20A, as in the first preferred embodiment, for example.

Third Preferred Embodiment

Figure 7:
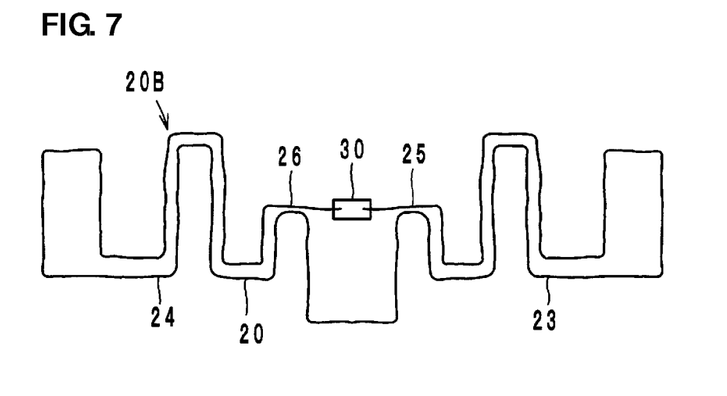
FIG. 7 is a plan view showing a wireless IC device according to a third preferred embodiment of the present invention.

A wireless IC device according to a third preferred embodiment is manufactured by bending the radiation portions 23 and 24 of an antenna 20B into a meandering pattern, as shown in FIG. 7. The remaining configuration of the third preferred embodiment is preferably the same or substantially the same as that of the first preferred embodiment. The line length of the meandering-shaped radiation portions 23 and 24, that is, the length from the power feed portions to the corresponding folded-back portions preferably is about λ/4, for example, wherein λ denotes a wavelength that is used. The effects and the advantages of the third preferred embodiment are the same as those of the first preferred embodiment. The electromagnetic coupling module including the wireless IC chip 50 and the feed circuit board 40, shown in the second preferred embodiment, may be used, instead of the wireless IC chip 30.

Fourth Preferred Embodiment

Figure 8:
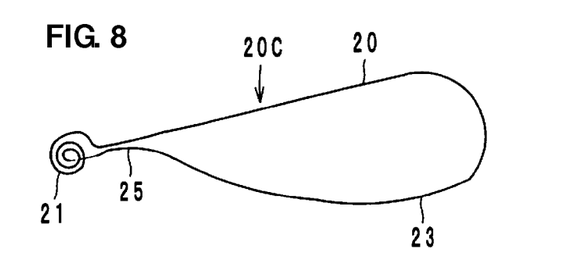
FIG. 8 is a plan view showing an antenna of a wireless IC device according to a fourth preferred embodiment of the present invention.

A wireless IC device according to a fourth preferred embodiment includes an antenna 20C shown in FIG. 8. The antenna 20C including the radiation portion 23 manufactured by folding back one lead wire 20 into a loop shape. The lead wire 20 includes the coil-shaped power feed portion 21 providing an inductance at its one end. The lead wire portion 20 toward the folded-back portion and the lead wire portion 20 through the folded-back portion are close to each other near the power feed portion 21 in the radiation portion 23. The other end of the lead wire 20 through the proximity portion 25 is electrically connected to the end of the power feed portion 21.

Fifth Preferred Embodiment

Figure 9:
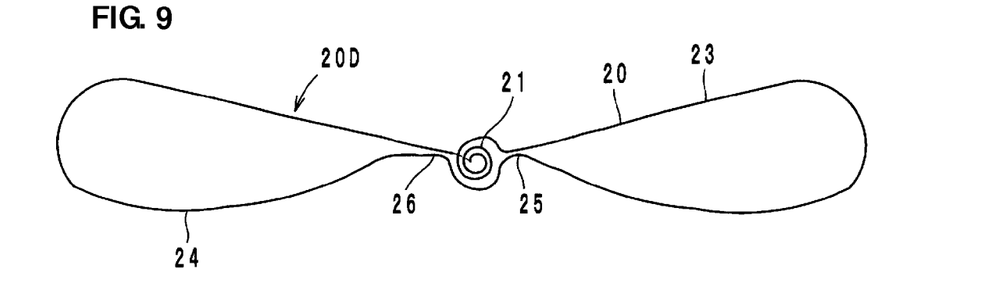
FIG. 9 is a plan view showing an antenna of a wireless IC device according to a fifth preferred embodiment of the present invention.

A wireless IC device according to a fifth preferred embodiment includes an antenna 20D shown in FIG. 9. The antenna 20D includes the first radiation portion 23 that is manufactured by folding back one lead wire 20 into a loop shape and the second radiation portion 24 that extends from the first radiation portion 23 and is folded back into a loop shape. The lead wire 20 includes the coil-shaped power feed portion 21 providing an inductance at its one end. The lead wire portion 20 toward the folded-back portion and the lead wire portion 20 through the folded-back portion are close to each other near the power feed portion 21 in the radiation portions 23 and 24 (the proximity portions are denoted by reference numerals 25 and 26). The other end of the lead wire 20 through the proximity portion 26 is electrically connected to the end of the power feed portion 21.

A feed circuit incorporated in a feed circuit board 140 (refer to FIG. 10) on which the wireless IC chip 50 is mounted is coupled to each of the antennas 20C and 20D having the above configurations. An example of the feed circuit will now be described with reference to FIG. 10. The feed circuit board 140 is manufactured preferably by stacking multiple sheets 141a to 141g on which electrodes are provided. The sheets 141a to 141g are each made of ceramic or resin, for example.

Figure 10:
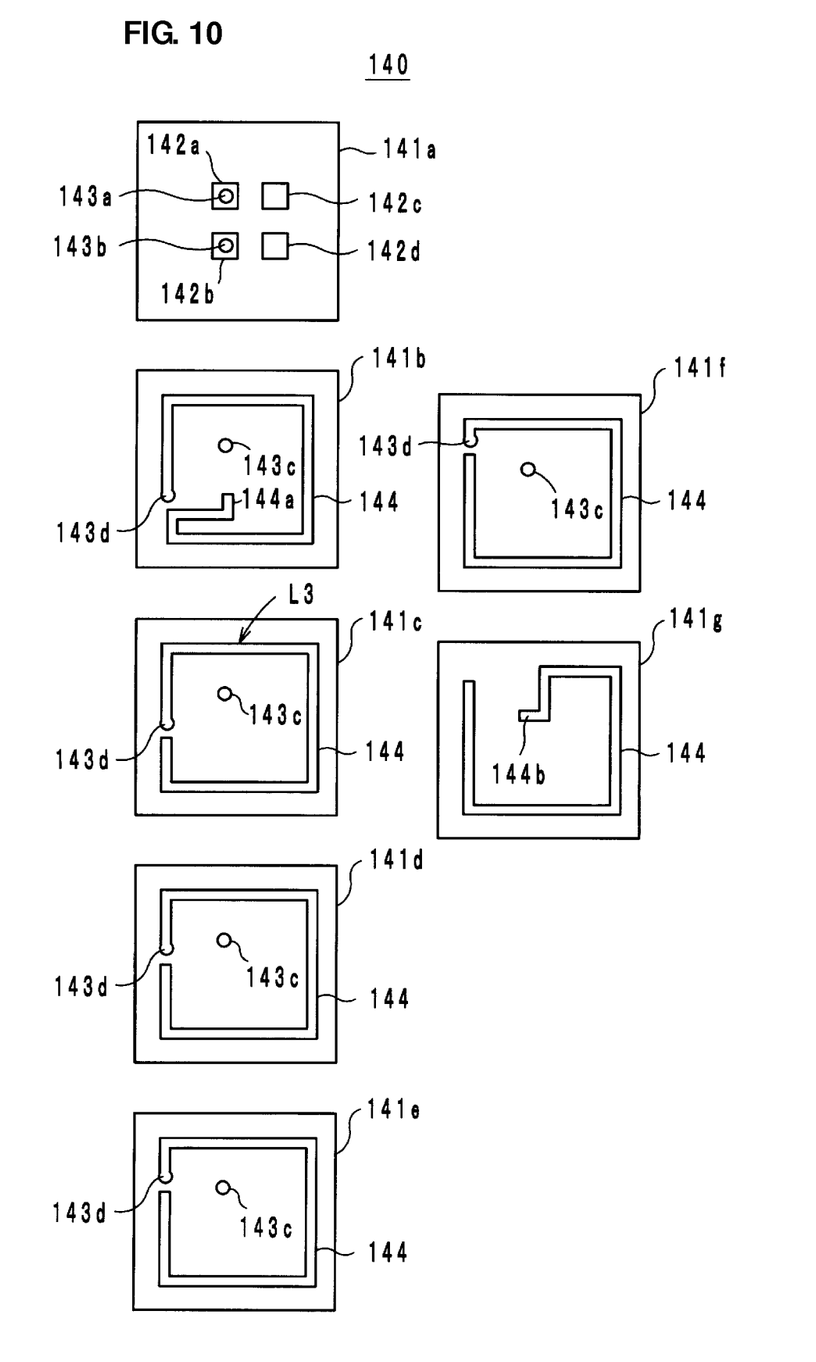
FIG. 10 is a plan view showing a layered structure of a feed circuit board of each of the wireless IC devices according to the fourth and fifth preferred embodiments of the present invention.

The sheet 141a includes electrodes 142a to 142d provided thereon and has via-hole conductors 143a and 143b provided therein. The sheets 141b to 141f each include an electrode 144 provided thereon and each include via-hole conductors 143c and 143d provided therein. The sheet 141g includes the electrode 144 provided thereon.

Stacking the respective sheets 141a to 141g causes the electrodes 144 on the respective sheets to be electrically connected to each other via the via-hole conductor 143d to provide an inductance element L3. An end of the inductance element L3 (an end 144a of the electrode 144 on the sheet 141b) is connected to the electrode 142b on the sheet 141a through the via-hole conductor 143b. The other end of the inductance element L3 (an end 144b of the electrode 144 on the sheet 141g) is connected to the electrode 142a on the sheet 141a through the via-hole conductors 143c and 143a. The inductance element L3 resonates at a certain resonant frequency determined by the inductance of the inductance element L3 and a line capacitance of the electrode 144.

The electrodes 142a and 142b on the sheet 141a are connected to the input-output terminal electrodes 51a and 51b of the wireless IC chip 50. The electrodes 142c and 142d on the sheet 141a are connected to the mounting terminal electrodes 52a and 52b of the wireless IC chip 50. In addition, the inductance element L3 is coupled to the power feed portion 21 of each of the antenna 20C and 20D. Specifically, with the feed circuit board 140 including the inductance element L3 being arranged on the power feed portion 21, an eddy current is excited in the power feed portion 21 in a direction that cancels the magnetic field of the inductance element L3 and the eddy current is transferred to the radiation portions 23 and 24. Since the power feed portion 21 is coil-shaped, the path of the magnetic field is created to allow the magnetic field of the inductance element L3 to be kept. Although the inductance element L3 having a coil axis vertical to the coil-shaped power feed portion 21 preferably is shown in FIG. 10, an inductance element having a coil axis parallel or substantially parallel to the coil-shaped power feed portion 21 is magnetically coupled to the power feed portion 21.

Each of the antennas 20C and 20D coupled to the feed circuit board 140 on which the wireless IC chip 50 is mounted receives a high-frequency signal (for example, within the UHF band) radiated from a reader-writer through the radiation portions 23 and 24, resonates the feed circuit magnetically coupled to the coil-shaped power feed portion 21, and supplies only a reception signal having a certain frequency to the wireless IC chip 50. After the wireless IC chip 50 extracts certain energy from the received signal, reads out information that is stored by using the energy as a driving source, and performs matching with a certain frequency in the feed circuit, the wireless IC chip 50 radiates the information from the radiation portions 23 and 24 through the power feed portion 21 as a transmission signal and transmits the transmission signal to the reader-writer.

In each of the antennas 20C and 20D, the lead wire portions 20 defining the radiation portions 23 and 24 are close to each other at the proximity portions 25 and 26, respectively, to cause electromagnetic coupling between the lead wire portions 20 and signals are transmitted through short paths, as in the antenna 20A. The effects and the advantages of the antennas 20C and 20D are the same as those described in the first preferred embodiment.

In the fourth and fifth preferred embodiments, the resonant frequency of the coil-shaped power feed portion 21 is preferably set to a value higher than the resonant frequency of the resonant circuit included in the feed circuit board 140, for example. In view of only the antenna, the communication distance is increased when the resonant frequency is close to the resonant frequency of the resonant circuit. However, in consideration of communication failures when another wireless IC device is close to the wireless IC device or a dielectric body, such as a hand of a human being, is close to the wireless IC device, the resonant frequency of the power feed portion 21 is preferably set to higher frequencies.

In addition, since the power feed portion 21 is arranged immediately below the magnetic field radiated from the feed circuit board 140 and the inductance element L3 in the feed circuit board 140 is spirally shaped so that a current flows in the same direction as in the power feed portion 21, it is possible to more efficiently transfer the energy.

The wireless IC chip 50 is electrically connected to the feed circuit board 140 whereas it is sufficient for the feed circuit board 140 to adhere to each of the antenna 20C and 20D with insulating adhesive. The direction of adhesion may be arbitrarily set and the arrangement precision that is required is not so high.

Other Preferred Embodiments

The antenna, the method of manufacturing the antenna, and the wireless IC device according to the present invention are not limited to the preferred embodiments described above and changes and variations may be made within the spirit and scope of the present invention.

As described above, preferred embodiments of the present invention are useful for an antenna used in an RFID system, a method of manufacturing the antenna, and a wireless IC device. In particular, preferred embodiments of the present invention are superior in achieving a simple configuration, a simple manufacturing process, and excellent heat resistance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna comprising:
   a lead wire including a first power feed portion at one end thereof and a second power feed portion at another end thereof opposite to the one end; wherein
   the lead wire includes first and second radiation portions in which the lead wire is folded back at a first folded-back portion and a second folded-back portion, respectively, to define a loop shape;
   a lead wire portion extending toward each of the first and second folded-back portions and another lead wire portion extending away from each of the first and second folded-back portions are arranged adjacent to each other to define a first proximity portion and a second proximity portion, respectively, near the first and second power feed portions, the lead wire portions and the another lead wire portions being electromagnetically coupled at the first and second proximity portions;
   a loop is defined by the first power feed portion, the first proximity portion, the second proximity portion, and the second power feed portion of the lead wire and functions as an impedance matching portion;
   a portion of the lead wire including the first proximity portion and the first folded-back portion and another portion of the lead wire including the second proximity portion and the second folded-back portion function as a dipole antenna;
   the first and second power feed portions, the first and second radiation portions, and the first and second proximity portions are defined by only one single lead wire;
   the first and second proximity portions are the only electromagnetically coupled portions of the lead wire; and
   the one end and the another end of the lead wire are connected to an wireless IC chip such that the lead wire and the wireless IC chip define a loop-shaped pattern.

2. The antenna according to claim 1, wherein the radiation portion has a substantially trapezoidal shape.

3. The antenna according to claim 1, wherein a surface of the lead wire is covered with an insulating film.

4. The antenna according to claim 3, wherein the lead wire is a copper wire.

5. A method of manufacturing an antenna, the method comprising:
   a step of preparing a lead wire including a first power feed portion at one end thereof and a second power feed portion at another end thereof opposite to the one end; and
   a step of forming first and second radiation portions by folding back the lead wire at a first folded-back portion and a second folded-back portion, respectively, to define a loop shapes; wherein a lead wire portion extending toward each of the first and second folded-back portions and a lead wire portion extending away from each of the first and second folded-back portions are arranged adjacent to each other to define a first proximity portion and a second proximity portion, respectively, near the first and second power feed portions in the step of forming the first and second radiation portions, respectively, the lead wire portions and the another lead wire portions being electromagnetically coupled at the first and second proximity portions;

a loop is formed by the first power feed portion, the first proximity portion, the second proximity coupled portion, and the second power feed portion of the lead wire and functions as an impedance matching portion;

a portion of the lead wire including the first proximity portion and the first folded-back portion and another portion of the lead wire including the second proximity portion and the second folded-back portion function as a dipole antenna;

the first and second power feed portions, the first and second radiation portions, and the first and second proximity portions are defined by only one single lead wire;

the first and second proximity portions are the only electromagnetically coupled portions of the lead wire; and the one end and the another end of the lead wire are connected to an wireless IC chip such that the lead wire and the wireless IC chip define a loop-shaped pattern.

6. A wireless IC device comprising:

an antenna including:
- a lead wire including a first power feed portion at one end thereof and a second power feed portion at another end thereof opposite to the one end; wherein
- the lead wire includes first and second radiation portions in which the lead wire is folded back at a first folded-back portion and a second folded-back portion, respectively, to define a loop shape;
- a lead wire portion extending toward each of the first and second folded-back portions and another lead wire portion extending away from each of the first and second folded-back portions are arranged adjacent to each other to define a first proximity portion and a second proximity portion, respectively, near the first and second power feed portions, the lead wire portions and the another lead wire portions being electromagnetically coupled at the first and second proximity portions;
- a loop is defined by the first power feed portion, the first proximity portion, the second proximity portion, and the second power feed portion of the lead wire and functions as an impedance matching portion; and
- a portion of the lead wire including the first proximity portion and the first folded-back portion and another portion of the lead wire including the second proximity portion and the second folded-back portion function as a dipole antenna; and a wireless IC chip or a feed circuit board including a feed circuit coupled to a wireless IC; wherein the wireless IC chip or the feed circuit is coupled to the first and second power feed portions of the antenna;

the first and second power feed portions, the first and second radiation portions, and the first and second proximity portions are defined by only one single lead wire;

the first and second proximity portions are the only electromagnetically coupled portions of the lead wire; and the one end and the another end of the lead wire are connected to an wireless IC chip such that the lead wire and the wireless IC chip define a loop-shaped pattern.

7. The wireless IC device according to claim 6, wherein the radiation portion has a substantially trapezoidal shape.

8. The wireless IC device according to claim 6, wherein the feed circuit includes a resonant circuit, and a resonant frequency of the resonant circuit substantially determines frequencies of transmission and reception signals in the radiation portion.

9. The wireless IC device according to claim 6, wherein the power feed portion is soldered to the wireless IC chip or the feed circuit board.

* * * * *